US 7,205,763 B2

(12) United States Patent
Porter

(10) Patent No.: US 7,205,763 B2
(45) Date of Patent: Apr. 17, 2007

(54) MOVEMENT-CORRECTED MULTI-SHOT METHOD FOR DIFFUSION-WEIGHTED IMAGING IN MAGNETIC RESONANCE TOMOGRAPHY

(75) Inventor: David Andrew Porter, Poxdorf (DE)

(73) Assignee: Siemens Aktiengesellschaft, Munich (DE)

(*) Notice: Subject to any disclaimer, the term of this patent is extended or adjusted under 35 U.S.C. 154(b) by 19 days.

(21) Appl. No.: 11/104,940

(22) Filed: Apr. 13, 2005

(65) Prior Publication Data
US 2005/0237057 A1    Oct. 27, 2005

(30) Foreign Application Priority Data
Apr. 13, 2004  (DE)  .................... 10 2004 017 852

(51) Int. Cl.
*G01V 3/00*    (2006.01)
(52) U.S. Cl. ...................................... 324/306; 324/307
(58) Field of Classification Search ................ 324/306, 324/307, 309
See application file for complete search history.

(56) References Cited

U.S. PATENT DOCUMENTS

| 6,331,777 | B1 * | 12/2001 | Van Den Brink et al. | .. 324/312 |
| 6,528,996 | B1 * | 3/2003 | Sato | ............................ 324/307 |
| 6,791,323 | B2 * | 9/2004 | Wang et al. | ................. 324/309 |
| 6,842,000 | B2 * | 1/2005 | Norris et al. | ............... 324/309 |
| 7,057,388 | B2 * | 6/2006 | Harvey et al. | .............. 324/309 |

* cited by examiner

*Primary Examiner*—Louis M. Arana
(74) *Attorney, Agent, or Firm*—Schiff Hardin LLP

(57) ABSTRACT

In a multi-shot method for diffusion-weighted imaging in magnetic resonance tomography, the sampling of the k-matrix in the readout direction ensues in segments, and immediately after acquisition of an image data set by readout of one segment by means of echo signals, a navigation data set is acquired by readout of the middle region of the k-matrix at virtually the same time. A movement-corrected diffusion-weighted MRT image is generated by combining of the image data sets with the corresponding navigation data sets and subsequent Fourier transformation.

13 Claims, 3 Drawing Sheets

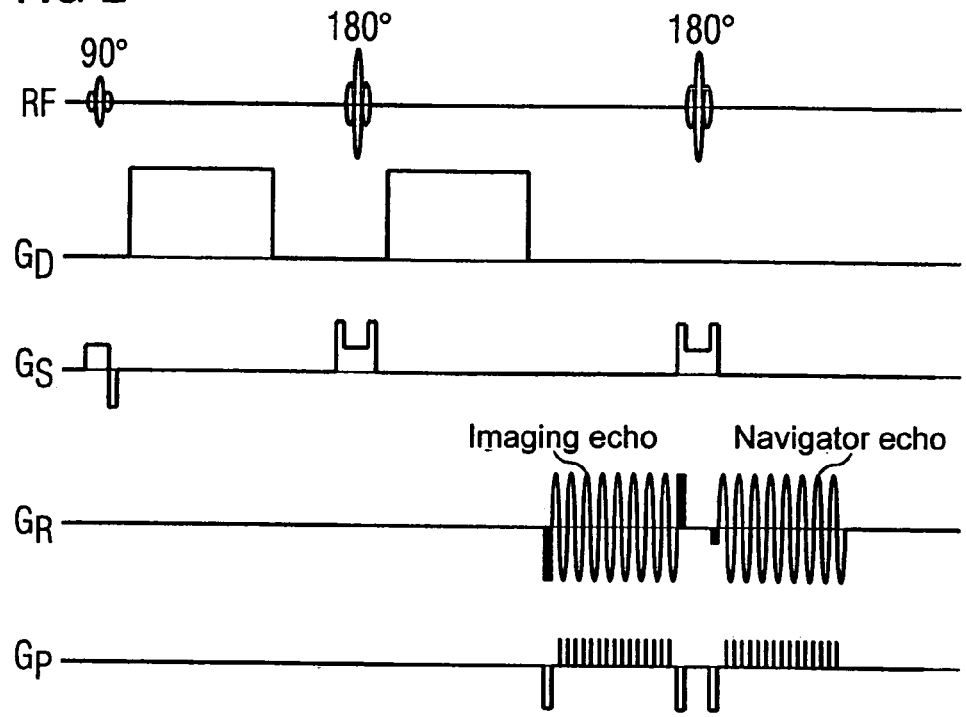
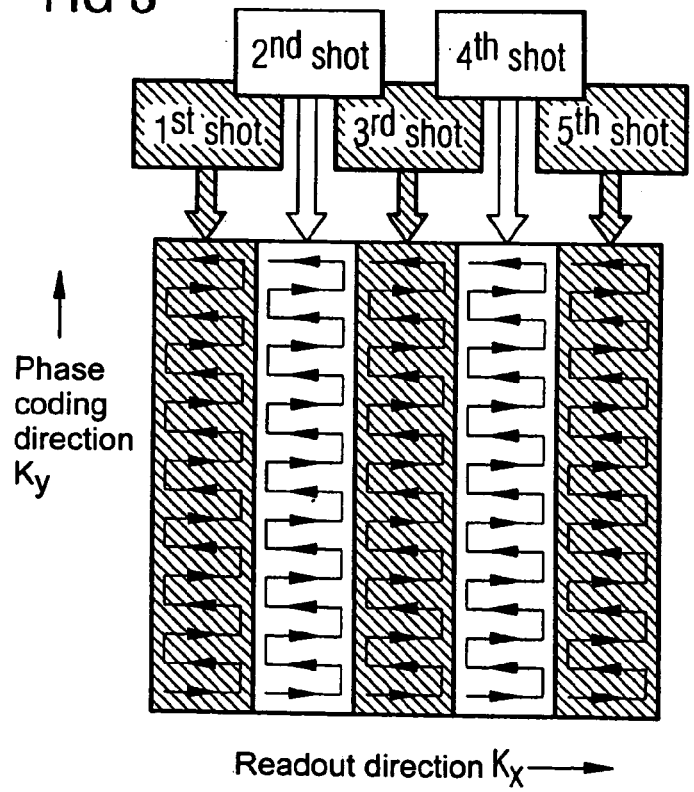

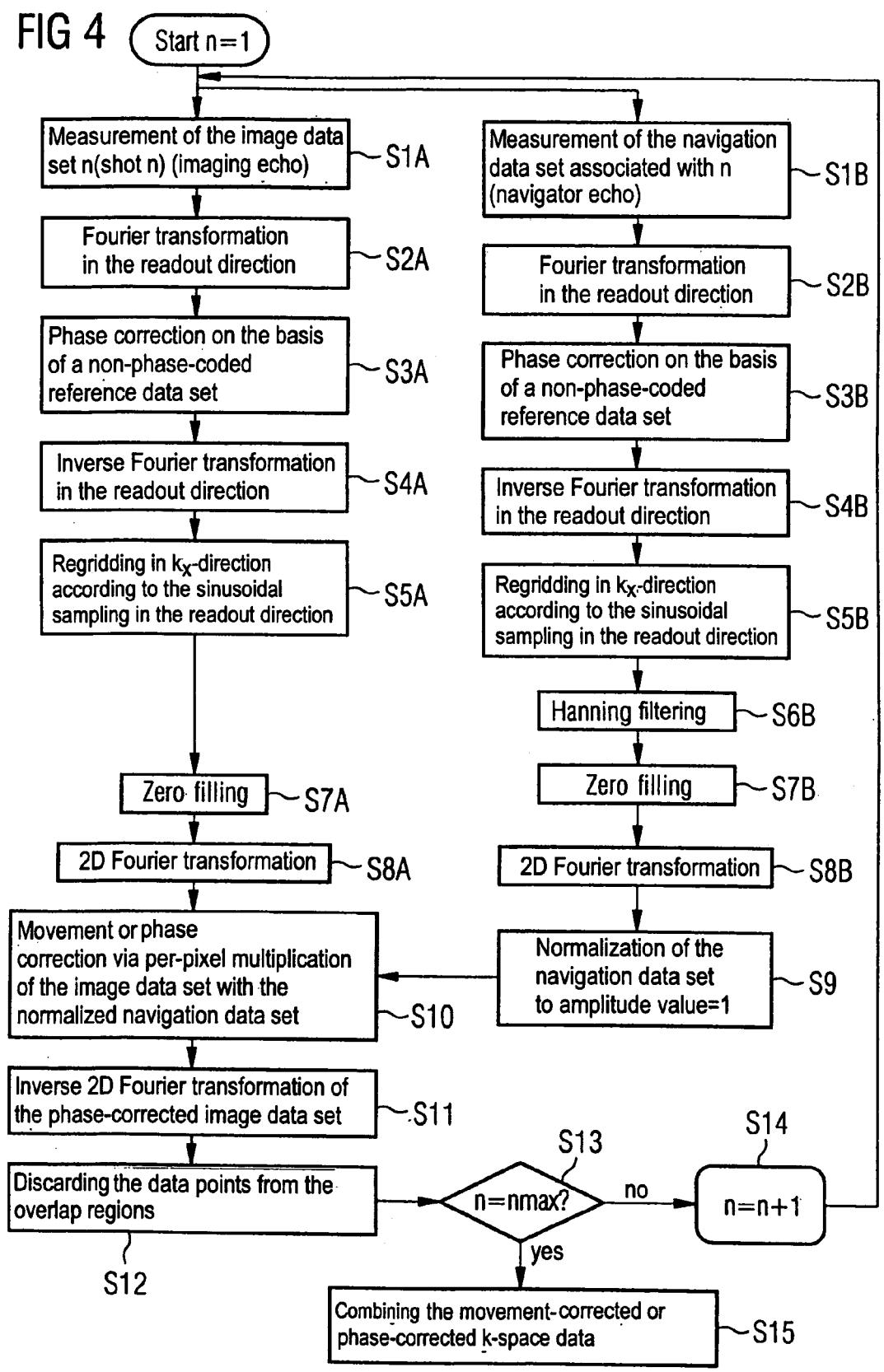

MOVEMENT-CORRECTED MULTI-SHOT METHOD FOR DIFFUSION-WEIGHTED IMAGING IN MAGNETIC RESONANCE TOMOGRAPHY

BACKGROUND OF THE INVENTION

1. Field of the Invention

The present invention concerns nuclear magnetic resonance tomography as applied in medicine for examination of patients. The present invention in particular concerns a movement-corrected multi-shot method for diffusion-weighted imaging in magnetic resonance tomography.

2. Description of the Prior Art

MRT is based on the physical phenomenon of nuclear magnetic resonance and has been successfully used as an imaging method for over 15 years in medicine and biophysics. In this examination method, the subject is exposed to a strong, constant magnetic field (called the $B_0$ field). The nuclear spins of the atoms in the subject, which were previously randomly oriented, thereby align. Radio-frequency energy can now excite these "ordered" nuclear spins to a specific oscillation. In MRT, this oscillation generates the actual measurement signal that is acquired by appropriate reception coils. By the use of non-homogeneous magnetic fields generated by gradient coils, the signals from the measurement subject can be spatially coded in all three spatial directions, generally designated as "spatial coding".

In the evaluation of pathophysiological procedures, in particular in the human brain (for example given a stroke), a relatively new MRT technology has proven to be particularly effective: diffusion-weighted magnetic resonance tomography.

Diffusion is created by the thermal translation movement of molecules. It is a random process that is also designated as Brownian molecular movement. The distances traveled by the molecules considered in diffusion-weighted MRT measurements are very small; for example, unrestricted water molecules diffuse in a typical manner in every direction over a distance of approximately 20 μm in 100 ms or 60 μm in one second. These distances lie in the order of magnitude of individual cells, of human tissue.

By the use of markedly strong magnetic gradient fields (known as diffusion gradients) that, in this technique, are applied in a continuous manner or in pulses in addition to the spatially-coded gradient fields cited above, a collective diffusion movement of the respective molecules (in particular water) becomes noticeable as an attenuation of the magnetic resonance signal. Regions in which diffusion occurs therefore are more or less characterized as dark regions in the actual MRT image, dependent on the strength of the diffusion.

Diffusion-weighted MRT sequences typically are composed of three parts:

1. spin excitation (typically in the form of a slice-selective 90° RF pulse)
2. a diffusion preparation step and
3. an imaging readout module.

In its most general form, the diffusion preparation uses the typical Stejskal-Tanner technique, whereby a bipolar gradient pulse is switched with the two pulses separated by a 180° RF refocusing pulse. Newer sequences use a two-fold bipolar gradient pulse with an additional 180° RF refocusing pulse in order to reduce the influence of interfering eddy currents that would lead to image artifacts. In principle, after the diffusion preparation various imaging sequences can be used in the framework of the imaging readout module in order to generate diffusion-weighted images. One problem of the diffusion-weighted imaging is, however, the marked sensitivity to non-diffusion-like movement types such as: heart movement, breathing movement, etc. and the movements associated with these such as, for example, brain pulsation (movement of the brain in cerebral fluid). In particular in multi-shot sequences in MRT, such movements cause phase shifts in the nuclear magnetic resonance signal during the respective diffusion preparation, which leads to strong image artifacts. The use of diffusion imaging as a clinical examination method therefore has made possible for the first time the continuous development of faster measurement techniques such as, for example, echo planar imaging (EPI). EPI is a markedly faster measurement method in MRT. Given the use of single-shot echo planar imaging (SSEPI sequences), image artifacts that are created due to unpreventable movement types can be reduced or prevented. Movements as occur in conventional diffusion-weighted imaging sequences in effect can be "frozen" with SSEPI.

A disadvantage of SSEPI, however, is that, due to the low bandwidth per pixel in the phase coding direction, a strong B0 field dependency of the measurement signal exists. In regions with strong susceptibility gradients (such as, for example, in front temporal lobes or in the frontal lobes of the human brain) this leads to strong image artifacts. A general dependency of the image with regard to the eddy current-induced interferences of the basic magnetic field additionally exists. Since such eddy currents typically are induced by the diffusion preparation gradient pulses, these vary with the difference gradient direction and a quantity known as the b-value, which characterizes the diffusion. This leads to the image interference differing dependent on different preparation procedures and the image reconstruction then being impaired when diffusion-weighted images are combined in order to create parameter maps such as, for example, ADC (Apparent Division Coefficient) maps.

A further disadvantage of the SSEPI sequence is the very significant $T_2^*$ dependency ($T_2^*$ is the decay duration of the transverse magnetization due to local magnetic field inhomogeneities) o the very strong phase sensitivity, dependent on the type of the phase coding of an SSEPI sequence. Both result in strong image erasure artifacts and distortion artifacts, in particular in body imaging with the typically short T2 times of human tissue.

One possibility to prevent $B_0$ sensitivities as occur, for example, in SSEPI is to use other single-shot sequences, for example RARE, HASTE or GRASE. RARE, HASTE and GRASE acquire the magnetic resonance signal in the form of a spin echo pulse train that is generated by emission of a number of radio-frequency refocusing pulses. The refocusing of the magnetization inverts the phase curve, making the sequence insensitive with regard to susceptibility artifacts. The $T_2$ decay of the magnetization limits the signal readout time to approximately 300 ms, which in turn limits the maximum resolution that can be achieved. EPI as well as RARE, HASTE and GRASE can be improved with regard to the resolution by the use of parallel acquisition techniques (PAT).

In diffusion-weighted imaging, the readout of a number of spin echoes also has the severe disadvantage that movement-induced phase shifts of the magnetization occur during the diffusion preparation that negate the Carr-Purcell-Meiboom-Gill (CPMG) condition. This condition is fulfilled when the excitation pulses exhibit a 90° shift in comparison to the subsequent refocusing pulses, but is no longer fulfilled when a non-reversible phase change occurs between the RF excitation and the first refocusing pulse. A non-reversible phase change is a phase change that cannot be reversed by the refocusing pulse (echo-like) (for example a movement-induced phase change occurring in diffusion sequences). A reversible phase change is, for example, a phase evolution caused by resonance offset. Non-fulfillment of the CPMG condition and artifacts caused thereby are more likely to occur as fewer RF or refocusing pulses are used.

In order to prevent such artifacts, modified diffusion preparation techniques can be used that are based on stimulated echo sequences. However, these exhibit a two-fold variation of the signal-to-noise ratio (SNR). A single-shot spiral scan can also be used in order to acquire data in the framework of a diffusion-weighted imaging without artifacts (with regard to movement artifacts). Just like EPI, this technique does not use multiple RF refocusing pulses, which leads to a phase evolution due to off-resonant signals that severely impairs the image quality.

Multi-shot techniques represent a reasonable alternative in order to circumvent the disadvantages of single-shot techniques in diffusion-weighted imaging. Multi-shot techniques improve the image quality by increasing the spatial resolution; image artifacts that occur in the single-shot technique (due to T2 decay, T2* decay and off-resonance effects), and can exert a strong influence on the imaging due to the long readout time, can be prevented.

The use of multi-shot sequences in diffusion-weighted imaging presents the developer with new challenges. The simple combination of a standard multi-shot sequence with a preliminary diffusion preparation using diffusion gradients leads to a movement-induced phase shift from shot to shot that is manifested by extremely strong ghost artifacts, in particular when brain exposures are made. Initial studies of the human body in which simple single-shot sequences and SSFP sequences (steady-state free precession sequences) have been combined with diffusion gradients show no movement dependency whatsoever given b-values below 200 s/mm². The b-value represents a value characterizing the diffusion-weighted measurement and is calculated according to a formula involving the condition of the diffusion gradients and of the gyromagnetic ratio of the considered magnetic resonant spin type. In the framework of standard examinations, given acute stroke such b-values amount to approximately 1000 s/mm², such that under these conditions ECG-triggered SE sequences, namely ECG-triggered stimulated echo sequences (STEAM) present a strong influence of the brain movement in multi-shot diffusion-weighted images.

There are various approaches to counteract the movement sensitivity of multi-shot methods. A sequence-based approach is to acquire the signal in the framework of multiple small-angle excitations immediately at the temporal end of the diastole of a heart cycle, in the framework of a high-speed STEAM technique. This method can likewise be understood as a single-shot approach in which a single preparation of the magnetization is implemented for all excitations. This technique shows all the advantages of an EPI sequence without dependency of susceptibility changes. However, a limitation of the resolution exists. High-speed Steam likewise exhibiting the disadvantage of a relatively low signal-to-noise ratio.

An important development in the field of diffusion-weighted multi-shot imaging was the idea to measure a signal known as a navigator echo in addition to the conventional-image data after each spin excitation. The data of each navigator echo are used for phase correction of the corresponding image data, with the phase change of the signal that occurs during the diffusion preparation, and varies between the different excitations, being taken into account. These navigator echoes (in the form of a non-phase-coded reference scan) are in principle one-dimensional and can actually be used only for correction of general phase changes or regional phase changes in the read-out direction. The movement-induced phase change in the diffusion-weighted imaging is a two-dimensional function, such that the one-dimensional approach is not suitable for a complete correction. This method consequently is not suitable for a clinical implementation in the form of a routine application.

For this reason, present movement-corrected diffusion-weighted imaging sequences use two-dimensional navigator signals that are interleaved with the conventional acquisition sequence. Adjacent raw data lines are acquired in separate parts. However this leads to the scanning (sampling) not fulfilling the Nyquist condition and wrap-arounds occurring in the image domain. A direct, uncomplicated application of the two-dimensional movement correction (phase correction) is possible only when simplified assumptions are made, for example that of a rigid body motion. Such an assumption of rigid body motion is not valid for the brain deformation, in particular of the ventricle and of the brain stem.

A technique known as PROPELLER (Periodically Rotated Overlapping ParallEL Lines with Enhanced Reconstruction) is an exception, in which, after each shot, a set of parallel adjacent k-space lines (resembling a propeller blade) are acquired by means of a spin-echo pulse train. The direction of a blade is rotated after each spin excitation, such that the entire k-matrix is two-dimensionally scanned in a star shape. Since each blade contains the central region of the k-matrix, each shot is provided with 2D navigator information, which is why the sequence can also be designated as self-navigating. The Nyquist condition is also fulfilled for each blade, so a low-resolution image-based 2D phase correction is possible. Because in each shot the central k-space region is measured, the phase correction primarily concerns higher frequencies, which leads to a reduction of image artifacts. However, with PROPELLER the CPMG condition generally is not fulfilled, which leads to a signal modulation between adjacent spin echoes. The signal modulation concerns adjacent lines due to the T2 relaxation and due to movement-induced effects. A radial scan as is implemented with PROPELLER is also less efficient in comparison to standard scan sequences such as, for example, segmented EPI, since in comparison to other sequences a much larger number of shots is necessary for a given matrix size.

Furthermore, it has been proposed to use multi-shot spiral scans in the framework of self-navigated diffusion-weighted sequences. However, such developments in this field do not include the two-dimensional phase correction necessary for a robust clinical application.

SUMMARY OF THE INVENTION

An object of the present invention is to provide an improved method for movement-corrected diffusion-weighted imaging in magnetic resonance tomography.

This object is achieved according to the invention by a multi-shot method for diffusion-weighted imaging for magnetic resonance tomography wherein scanning of the k-matrix ensues in segments in the readout direction. The imaging sequence is designed such that, immediately after obtaining an image data set by readout of a segment by means of imaging echo, at virtually the same time (i.e., contemporaneously) a navigation data set is acquired by readout of the central region of the k-matrix by means of navigator echo.

A movement-corrected diffusion-weighted MRT image is generated by combining the image data sets with the corresponding navigation data sets, and subsequent Fourier transformation.

The combination inventively ensues by pixel-by-pixel multiplication of each image data set with its correspondingly normalized navigation data set in the image domain, and subsequently combining the corrected segments.

The readout advantageously ensues along serpentine path.

It is furthermore advantageous when the segments overlap.

Furthermore, it is advantageous when image data set and navigation data set are equal in size.

In the inventive method, the pixels are discarded from the overlap regions after the multiplication.

Before the combination, a standard phase correction such as, for example, a linear phase correction in the readout direction,
a Hanning filtering and
a zero-filling can be optionally implemented on each image data set and its corresponding navigation data set.

In the multi-shot method according to the invention, the image sequence can include the following steps:

emitting a 90° radio-frequency excitation pulse to excite spins in a subject to be examined,
simultaneously switching (activating) a slice selection gradient (GS) during a 90° radio-frequency excitation pulse,
activating a first diffusion gradient pulse,
emitting a first 180° radio-frequency refocusing pulse,
activating a slice selection gradient during the first 180° radio-frequency refocusing pulse,
activating a second diffusion gradient pulse,
activating a first alternating readout gradient pulse train,
emitting a second 180° radio-frequency refocusing pulse,
activating a slice selection gradient during the second 180° radio-frequency refocusing pulse,
activating a second alternating readout gradient pulse train,
repeating of the steps, from emission of the first 90° radio-frequency excitation pulse to activation of the second alternating readout gradient pulse train, until the entire k-matrix is scanned.

According to the invention, a dephasing pulse is activated immediately before each first readout gradient pulse train and a rephasing pulse is also activated immediately after each first readout gradient pulse train, so that an offset (shift) is created in the readout direction such that each first readout gradient pulse train scans a sub-region of the k-matrix in the $k_x$-direction in a serpentine shape. Thus the entire k-matrix is scanned by the entirety of the first readout gradient pulse train.

A dephasing pulse is advantageously activated immediately before each second readout gradient pulse train and a rephasing pulse is also advantageously activated immediately after each second readout gradient pulse train, such that a constant offset is created in the readout direction such that a central sub-region of the k-matrix. The central sub-region is associated with a sub-range of a first readout gradient pulse train, is always scanned in a serpentine shape in the $k_x$-direction by each second readout gradient pulse train, this scan taking place at virtually the same time as each first readout gradient pulse train.

Furthermore, it is advantageous to achieve the serpentine shaped scan of the respective sub-range buy activating short phase-coded gradient pulses during each zero point of the respective readout gradient pulse train.

DESCRIPTION OF THE DRAWINGS

FIG. 2 schematically shows the time curve of the gradient pulse current functions of the inventive diffusion-weighted multi-shot sequence.

FIG. 3 schematically shows the temporal scanning of the k-matrix given a sequence according to FIG. 2.

FIG. 4 schematically shows a flow chart of the inventive method.

DESCRIPTION OF THE PREFERRED EMBODIMENTS

Figure 1:
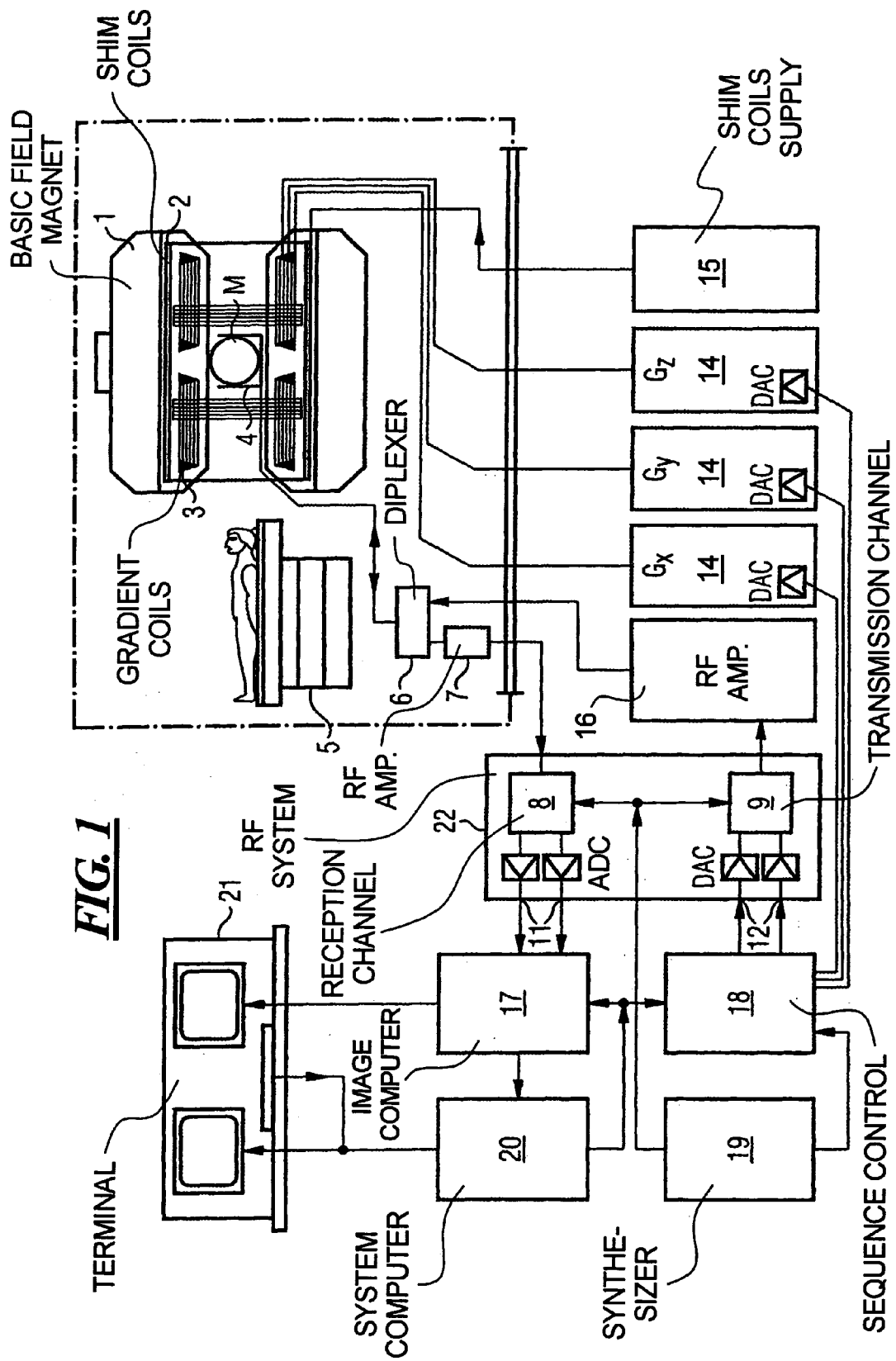
FIG. 1 schematically illustrates a magnetic resonance tomography apparatus for implementing the method.

FIG. 1 schematically illustrates a magnetic resonance tomography apparatus in which gradient pulses according to the present invention are generated. The design of the magnetic resonance tomography apparatus corresponds a conventional tomography apparatus, with the exceptions discussed below. A basic field magnet 1 generates a temporally constant strong magnetic field for polarization or alignment of the nuclear spins in the examination region of the subject such as, for example, a part of a human body to be examined. The high homogeneity of the basic magnetic field necessary for the magnetic resonance data acquisition is defined in a spherical measurement volume M in which the parts of the human body to be examined are introduced. For support of the homogeneity requirements, and in particular for elimination of temporally invariable influences, shim plates made from ferromagnetic material are mounted at a suitable location. Temporally variable influences are eliminated by shim coils 2 that are activated by a shim current supply 15.

A cylindrical gradient coil system 3 that is composed of three coils (windings) is used in the basic field magnet 1. Each coil is supplied with current by an amplifier 14 for generation of a linear gradient field in the respective direction of the Cartesian coordinate system. The first coil of the gradient field system 3 generates a gradient $G_x$ in the x-direction, the second coil generates a gradient $G_y$ in the y-direction and the third coil generates a gradient $G_z$ in the z-direction. Each amplifier 14 has a digital-analog converter that is activated by a sequence controller 18 for time-accurate generation of the gradient pulses.

Located within the gradient field system 3 is a radio-frequency antenna 4 that converts the radio-frequency pulses emitted by a radio-frequency power amplifier 16 into a magnetic alternating field for excitation of the nuclei and alignment of the nuclear spins of the subject to be examined, or of the region of the subject to be examined. The alternating field originating from the precessing nuclear spins (i.e. normally the nuclear spin echo signals caused by a pulse sequence composed of one or more radio-frequency pulses and one or more gradient pulses) is also converted by the radio-frequency antenna 4 into a voltage that is supplied via an amplifier 7 to a radio-frequency receiver channel 8 of a radio-frequency system 22. The radio-frequency system 22 furthermore has a transmission channel 9 in which are generated the radio frequency pulses for the excitation the nuclear spins. The respective radio-frequency pulses are digitally represented as a series of complex numbers conforming to a pulse sequence predetermined in the sequence controller 18 by the system computer 20. This number series is supplied as a real part and an imaginary part via respective inputs 12 to a digital-analog converter (DAC) in the radio-frequency system 22 and, from this, to a transmission channel 9. In the transmission channel 9, the pulse sequences are modulated with a radio-frequency carrier signal whose base frequency corresponds to the resonance frequency of the nuclear spins in the measurement volume.

Switchover from transmission mode to reception mode ensues with a transmission-reception diplexer 6. The radio-frequency antenna 4 radiates the radio-frequency pulses into the measurement volume M for excitation of the nuclear spins and samples resulting echo signals. The acquired nuclear magnetic resonance signals are phase-sensitively demodulated in the reception channel 8 of the radio-frequency system 22 and converted into a real part and an imaginary part of the measurement signal in a respective analog-digital converter. An image is reconstructed by an image computer 17 from the measurement data so acquired. The administration of the measurement data, the image data and the control programs ensues via a system computer 20. Based on control programs, the sequence controller 18 monitors the generation of the respectively desired pulse sequences and the corresponding sampling of k-space. The sequence controller 18 controls the time-accurate switching of the gradients, the emission of the radio-frequency pulses with defined phase and amplitude and the receipt of the magnetic resonance signals. The time base for the radio-frequency system 22 and the sequence controller 18 is provided by a synthesizer 19. The selection of corresponding control programs for generation of a nuclear magnetic resonance image as well as the representation of the generated magnetic resonance image ensues via a terminal 21 that has a keyboard as well as one or more screens.

The present invention involves the generation of a distinctive imaging sequence that can be generated in the sequence controller 18 or in the system computer 20. A diagram of the inventive sequence is shown in FIG. 2. An initial 90° excitation pulse is shown in the uppermost line, followed by two 180° refocusing pulses. The slice selection gradient $G_S$ is activated during the 90° excitation pulse as well as during each 180° refocusing pulses for selection of the slice. The diffusion preparation in the inventive sequence ensues with two equal monopolar diffusion-gradients $G_0$ of defined width as well as defined amplitude, immediately after the 90° excitation pulse and immediately after the first 180° refocusing pulse. A significant feature of the inventive sequence is to sample (fill) the k-matrix with diffusion weighting and in segments, with the center region of the k-matrix being sampled virtually simultaneously in each segment. Each k-matrix segment is read out in the form of an imaging echo (and the associated central k-matrix region in the form of a navigator echo) with what are known as readout gradient pulse trains $G_R$. The first readout gradient pulse train of a shot, which reads out the imaging echo, is activated between the second diffusion gradient pulse and the second 180° refocusing pulse. The second readout gradient pulse train of a shot, which reads out the navigator echo, is activated immediately after the second 180° refocusing pulse. Each readout gradient pulse train of each shot is an alternating trapezoidal or sinusoidal pulse train, with a short phase coding gradient $G_P$ (blip) being activated during each zero crossing of the pulse train. The combination of alternating readout gradient and blipped phase coding gradient leads to only a relatively narrow range of the k-matrix having to be sampled per readout gradient pulse train with regard to the $k_x$-direction.

In order to sample the entire k-matrix with the first readout gradient pulse train of all shots, a pre-phasing gradient that leads to a corresponding offset in the $k_x$-direction in each first readout gradient pulse train is activated before each first readout gradient pulse train of each shot. The surface integral of the readout gradient pulse train establishes the width of the sampled region of the k-matrix in the $k_x$-direction. The surface integral of the pre-phase gradient defines the offset of the segment in the $k_x$-direction. In order to reset this $k_x$-offset after each shot, a rephasing gradient is activated inverted immediately after the first readout gradient pulse train of each shot of the respective pre-phasing gradient. The pre-phasing gradient as well as the rephasing gradient are shown black in FIG. 2.

In order to inventively obtain a navigator echo in immediate association (and thus almost simultaneously, i.e., contemporaneously) with each image echo of each shot, the second readout gradient pulse train of each shot is also provided with a dephasing pulse. In contrast to the rephasing pulses of the first readout gradient pulse trains, all dephasing pulses of all second readout gradient pulse trains are of constant, equal size in all shots, and in fact so large that the same central sub-region of the k-matrix is always sampled in a serpentine path at each $k_x$-segment of the first readout gradient pulse train. The dephasing pulse of the second readout gradient pulse train is also shown black in FIG. 2.

In this manner, the data to be entered into the k-matrix are obtained by sampling in segments (in shots), with the data in the central region of the k-matrix is sampled in the form of a navigator echo at each shot, virtually simultaneously with each image echo. Both readout gradient pulse trains are exactly equal—except for the $k_x$ offset—in each shot.

The k-space trajectory (sampling or data entry path) of the inventive imaging sequence is shown in FIG. 3 for the exemplary case of five shots with sixteen readout gradient pulses (number of the sample points in the $k_y$-direction). Each readout gradient pulse train necessitates fifteen phase coding gradients (blips). Each readout gradient pulse train, in combination with the blipped phase coding gradient, samples data for a strip-shaped region of the k-matrix in the $k_x$-direction, with the second readout gradient pulse train of each shot always sampling the same strips, namely, the middle strips (in this example, shot 3). The width of the strip in the $k_x$-direction is defined by the surface integral of the readout gradient pulse train. The integral of the pre-phase gradient defines the offset of the respective segment in the $k_x$-direction. The resolution in the $k_x$-direction within such a strip is determined by the sampling rate of the analog-digital converter (ADC) that is used.

The resolution within such a strip in the $k_y$-direction is defined by the number of the half-waves of the readout gradient pulse train. The time interval of two adjacent half-waves within a readout gradient pulse train is designated as "gradient echo spacing". The narrower the range, the more precisely the magnetic resonance signal is acquired with regard to the decay of the transverse magnetization characterized by $T_2^*$.

The goal of such an inventive imaging sequence design is to combine a diffusion-weighted multi-shot EPI (echo-planar imaging) sequence with the acquisition of two-dimensional navigator echoes in the framework of a segment-by-segment sampling in the readout direction in order to be able to suppress or correct movement-conditional artifacts between the individual shots in the framework of the image reconstruction method.

As mentioned above, in diffusion-weighted MRT imaging, multi-shot techniques deliver a much better image quality than single-shot technique (such as, for example, SSEPI). The presently most popular multi-shot technique is the PROPELLER technique described above, which, for example, allows diffusion-weighted MRT images of the human brain to be produced with reduced movement sensitivity without additional elaborate measures such as, for example, ECG triggering. Multi-shot EPI measurements also exhibit an extremely high movement sensitivity that clearly exceeds even that of PROPELLER.

By allowing the movement sensitivity of multi-shot EPI to be reduced or corrected after the data acquisition event as in the inventive method, this imaging technique offers a series of advantages relative to PROPELLOR:

shorter echo time TE
fewer k-space artifacts due to the $T_2$ relaxation
reduced scan duration
better slice profile
lower SAR (specific absorption rate) due to the lower number of 180° refocusing pulses per shot The inventive method corrects movement caused image artifacts of a diffusion-weighted multi-shot EPI sequence on the basis of the previously described inventive sequence designs (FIGS. 2 and 3) and supplies high-resolution, artifact-free diffusion-weighted MRT images. The inventive method is explained further in the following using the method flow diagram of FIG. 4.

Initially, according to step S1A a first image data set is acquired and according to step S1B its corresponding "simultaneous" navigation data set is acquired with a shot n=1 of the imaging sequence from FIG. 2. Both data sets are subsequently prepared according to the steps S2A through S8A and S2B through S8B, by means of image processing algorithms, for example on the system computer, in order to obtain qualitatively better raw data sets. The steps S2A through S4A and S2B through S4B concern a standard phase correction of the respective data set on the basis of a non-phase-coded reference data set in the image computer, acquired before the measurement, which takes into account the time delay of the ADCs from line to line. A rastering (regridding) of the sinusoidally-sampled or trapezoidally-sampled magnetic resonance signal ensues in step S5A and in S5B (distribution of the measurement points on a uniformly orthogonal grid; standard method in EPI). In step SB6, a Hanning filtering is implemented on the navigation data set (minimization of Gibbs-Ringing artifacts in the image space by resealing the k-space data in the edge region of the k-matrix by means of a weighting function). In the steps S7A and S7B, a zero-filling is implemented both on the image data set and on the navigation data set (this is necessary in order to be able to discard raw data points in the overlap regions in step S12). In steps S8A and S8B, a two-dimensional Fourier transformation subsequently ensues in the image domain in order to be able to implement a movement or phase correction of the image data set using the navigation data set.

A movement or phase correction is implemented for each shot. For this, in step S9 all amplitude values of the navigation data set are normalized to 1, such that movement-caused artifacts are manifested exclusively in the form of a phase pattern of the navigation data set. In step S10, movement correction of the image data set ensues by pixel-by-pixel multiplication of the complex image data set with the normalized complex navigation data set. Movement-caused phases in the image data set are reversed again for each pixel in this manner. A complex conjugation of both data sets (image data set, navigation data set) is already achieved by the second 180° refocusing pulse and does not have to be implemented separately.

A movement-induced 2D phase change in the image space causes a shifting or a redistribution of the data in k-space. A 2D phase correction effects a return shift or a reorganization in k-space. It may be the case, due to the movement, some measurement values have been shifted so far that they no longer appear in the measurement data acquisition window of a shot and are accordingly no longer considered in the 2D phase correction. The present invention solves this problem in that the segment-by-segment k-space sampling ensues such that the individual segments overlap to a sufficient degree that far-shifted measurement values of a shot can also still be detected and considered in the correction.

After a subsequent reverse transformation in k-space (by means of inverse 2D Fourier transformation), according to steps 11 the data points of the overlap regions can be discarded, since the measurement values necessary for the later phase-coded image have been exclusively shifted back into the non-overlapping segment region by the correction in steps 10.

In step S13 it is queried whether all segments necessary for a complete sampling of the k-matrix have already been acquired, and thus whether the maximum necessary number of shots have been applied. If this is not the case, a further shot is implemented (n=n+1) with the subsequent sequence of method steps S1A through S13. If the maximum number of shots has been achieved (n=nmax), the movement-corrected or phase-corrected segments are added to one another according to step S15 and the final image is achieved by subsequent Fourier transformation.

Given the same image resolution, first results of the inventive method clearly show fewer susceptibility-artifacts than a standard diffusion-weighted single-shot EPI measurement, in particular in brain exposures. The successful implementation of the inventive measure depends to a high degree on using the correct width of the individual segments in the readout direction ($k_x$-direction), so that all measurement points that are shifted but belong to a segment are considered, while the segments still are always sufficiently small so that the gradient echo spacing is short enough to minimize susceptibility artifacts. This generally can be achieved by a relatively high slew rate of the readout gradient pulse trains.

As mentioned above, it is advantageous in the framework of newer sequences to use a two-fold, bipolar gradient pulse with an additional 180° RF refocusing pulse in order to reduce the influence of interfering eddy currents that would lead to image artifacts. Such a two-fold, bipolar diffusion gradient pulse sequence is represented as follows in the diffusion preparation step:

first diffusion gradient pulse of first polarity (positive or negative)
first 180° pulse
second diffusion gradient pulse of second polarity (negative or positive)
immediately subsequent to this, third diffusion gradient pulse of first polarity (positive or negative)
second 180° pulse
fourth diffusion gradient pulse of second polarity (negative or positive).

The pulse length of the diffusion gradient pulses is calculated such that the influence of the eddy currents is compensated.

In the image readout portion of the inventive method, after the diffusion preparation the imaging sequence can be combined with a partial parallel imaging technique (PPA imaging technique: for example SMASH, SENSE, GRAPPA, etc.) in order to achieve an even shorter echo time TE and, effectively, an even shorter gradient echo spacing by a reduction of the measurement of raw data points.

To enable an even shorter echo time, the inventive method can be combined with a partial Fourier acquisition technique (for example the half-Fourier technique wherein half of the k-matrix is omitted).

Furthermore, it can be advantageous to modify the imaging readout portion of the inventive method such that a number of 180° RF refocusing pulses are used in the readout in order to read out different $k_y$ lines with different spin echoes (for example the even lines with the first imaging echo and the odd lines with the second imaging echo). In this manner, the gradient echo spacing can be reduced, allowing susceptibility artifacts (in particular at high basic field magnet strengths such as, for example, >3 Tesla) to be suppressed.

Although modifications and changes may be suggested by those skilled in the art, it is the intention of the inventor to embody within the patent warranted hereon all changes and modifications as reasonably and properly come within the scope of his contribution to the art.

I claim as my invention:

1. A multi-shot method for diffusion-weighted imaging in magnetic resonance tomography, comprising the steps of:
   entering magnetic resonance data from an examination subject into a k-matrix in a readout direction in a plurality of segments, including a plurality of segments each representing an image dataset, comprising a plurality of image dataset pixels, acquired by reading out echo signals and, for each of said plurality of segments representing an image dataset, substantially simultaneously reading out an associated navigation dataset, comprising a plurality of navigation dataset pixels, and entering said navigation dataset into a central region of said k-matrix;
   normalizing each navigation dataset to obtain a normalized navigation dataset, also comprising a plurality of pixels; and
   generating a movement-corrected, diffusion weighted magnetic resonance tomography image by multiplying each image dataset with its associated normalized navigation dataset pixel-by-pixel and combining each multiplication result, to obtain a combined dataset, and Fourier transforming said combined dataset.

2. A method as claimed in claim 1 comprising entering each image dataset and each navigation dataset into said k-matrix along a serpentine path.

3. A method as claimed in claim 1 comprising entering said segments representing said image datasets and said segments representing said navigation dataset with neighboring segments overlapping.

4. A method as claimed in claim 1 comprising before combining each image dataset with its associated navigation dataset, subjecting the image dataset and its associated navigation dataset to a standard phase correction.

5. A multi-shot method for diffusion-weighted imaging in magnetic resonance tomography, comprising the steps of:
   entering magnetic resonance data from an examination subject into a k-matrix in a readout direction in a plurality of segments, including a plurality of segments each representing an image dataset acquired by reading out echo signals and, for each of said plurality of segments representing an image dataset, substantially simultaneously reading out an associated navigation dataset and entering said navigation dataset into a central region of said k-matrix included each image dataset and its associated navigation dataset being the same; and
   generating a movement-corrected, diffusion weighted magnetic resonance tomography image by combining each image dataset with its associated navigation dataset, to obtain a combined dataset, and Fourier transforming said combined dataset.

6. A multi-shot method for diffusion-weighted imaging in magnetic resonance tomography, comprising the steps of:
   entering magnetic resonance data from an examination subject into a k-matrix in a readout direction in a plurality of segments, including a plurality of segments each representing an image dataset acquired by reading out echo signals and, for each of said plurality of segments representing an image dataset, substantially simultaneously reading out an associated navigation dataset and entering said navigation dataset into a central region of said k-matrix;
   subjecting the image dataset and its associated navigation dataset to a regridding in the readout direction; and
   generating a movement-corrected, diffusion weighted magnetic resonance tomography image by combining each image dataset with its associated navigation dataset, to obtain a combined dataset, and Fourier transforming said combined dataset.

7. A multi-shot method for diffusion-weighted imaging in magnetic resonance tomography, comprising the steps of:
   entering magnetic resonance data from an examination subject into a k-matrix in a readout direction in a plurality of segments, including a plurality of segments each representing an image dataset acquired by reading out echo signals and, for each of said plurality of segments representing an image dataset, substantially simultaneously reading out an associated navigation dataset and entering said navigation dataset into a central region of said k-matrix;
   subjecting the image dataset and its associated navigation dataset to Hanning filtering; and
   generating a movement-corrected, diffusion weighted magnetic resonance tomography image by combining each image dataset with its associated navigation dataset, to obtain a combined dataset, and Fourier transforming said combined dataset.

8. A multi-shot method for diffusion-weighted imaging in magnetic resonance tomography, comprising the steps of:
   entering magnetic resonance data from an examination subject into a k-matrix in a readout direction in a plurality of segments, including a plurality of segments each representing an image dataset acquired by reading out echo signals and, for each of said plurality of segments representing an image dataset, substantially simultaneously reading out an associated navigation dataset and entering said navigation dataset into a central region of said k-matrix;
   subjecting the image dataset and its associated navigation dataset to a zero filling; and
   generating a movement-corrected, diffusion weighted magnetic resonance tomography image by combining each image dataset with its associated navigation dataset, to obtain a combined dataset, and Fourier transforming said combined dataset.

9. A multi-shot method for diffusion-weighted imaging in magnetic resonance tomography, comprising the steps of:

emitting a 90° radio frequency excitation pulse to excite nuclear spins in the subject;

simultaneously activating a slice selection gradient during said 90° radio frequency excitation pulse;

emitting a first diffusion gradient pulse;

emitting a first 180° radio frequency refocusing pulse;

activating a slice selection gradient during said first 180° radio frequency refocusing pulse;

activating a second diffusion gradient pulse;

activating a first alternating readout gradient pulse train for reading out echo signals as magnetic resonance data forming an image dataset;

emitting a second 180° radio frequency refocusing pulse;

activating a slice selection gradient during said second 180° radio frequency refocusing pulse;

activating a second alternating readout gradient pulse train for reading out a navigation dataset;

repeating the above steps, from emission of said first 90° radio frequency excitation pulse to activating said second alternating readout gradient pulse train, until an entirety of the k-matrix is filled by entering magnetic resonance data from an examination subject into said k-matrix in a readout direction in a plurality of segments, including a plurality of segments each representing an image dataset acquired by reading out echo signals and, for each of said plurality of segments representing an image dataset, substantially simultaneously reading out an associated navigation dataset and entering said navigation dataset into a central region of said k-matrix; and generating a movement-corrected, diffusion weighted magnetic resonance tomography image by combining each image dataset with its associated navigation dataset, to obtain a combined dataset, and Fourier transforming said combined dataset.

10. A method as claimed in claim 9 comprising activating a dephasing pulse immediately before each first readout gradient pulse train and activating a rephasing pulse immediately after each first readout gradient pulse train, thereby producing an offset in the readout direction so that each first readout gradient pulse train samples a segment in said readout direction in a serpentine path, so that said entirety of said k-matrix is filled by a totality of said first readout gradient pulse trains.

11. A method as claimed in claim 10 comprising activating a dephasing pulse immediately before each second readout gradient pulse train and activating a rephasing pulse immediately after each second readout gradient pulse train, to produce a constant offset in the readout direction in said central region of said k-matrix, said central region being associated in a movement-specific manner with a segment of said first readout gradient pulse train and always being sampled in a serpentine path in said readout direction by each second readout gradient pulse train substantially simultaneously with said first readout gradient pulse train.

12. A method as claimed in claim 10 comprising sampling along said serpentine-shaped path by activating short phase coding gradient pulses during each zero crossing of each of said gradient pulse trains.

13. A multi-shot method for diffusion-weighted imaging in magnetic resonance tomography, comprising the steps of:

entering magnetic resonance data from an examination subject into a k-matrix in a readout direction in a plurality of segments with neighboring segments overlapping, including a plurality of segments each representing an image dataset, comprising a plurality of image dataset pixels, acquired by reading out echo signals and, for each of said plurality of segments representing an image dataset, substantially simultaneously reading out an associated navigation dataset, comprising a plurality of navigation dataset pixels, and entering said navigation dataset into a central region of said k-matrix;

normalizing each navigation dataset to obtain a normalized navigation dataset, also comprising a plurality of pixels; and generating a movement-corrected, diffusion weighted magnetic resonance tomography image by multiplying each image dataset with its associated normalized navigation dataset pixel-by-pixel, and discarding pixels in an overlapping region after multiplication, and combining each multiplication result, to obtain a combined dataset, and Fourier transforming said combined dataset.

* * * * *